United States Patent [19]
Jakob et al.

[11] 4,409,641
[45] Oct. 11, 1983

[54] ENVIRONMENTALLY PROTECTED ELECTRONIC NETWORK STRUCTURE AND HOUSING COMBINATION

[75] Inventors: Gert Jakob, Stuttgart; Willi Gansert, Kornwestheim; Siegfried Goetzke, Bietigheim-Bissingen; Lothar Ruttkowski, Ludwigsburg, all of Fed. Rep. of Germany

[73] Assignee: Robert Bosch GmbH, Stuttgart, Fed. Rep. of Germany

[21] Appl. No.: 262,914

[22] Filed: May 12, 1981

[30] Foreign Application Priority Data

Jun. 2, 1980 [DE] Fed. Rep. of Germany ....... 3020902

[51] Int. Cl.³ ............................................. H05K 7/20
[52] U.S. Cl. .................................. 361/386; 361/399; 339/17 LC
[58] Field of Search ............ 339/17 C, 17 LC, 112 R; 361/331, 356, 364, 369, 392, 394, 386, 388, 395, 399

[56] References Cited

U.S. PATENT DOCUMENTS

| 3,714,369 | 1/1973 | Bunten | 361/356 |
| 3,746,936 | 7/1973 | Coffey | 361/356 |
| 4,047,242 | 9/1977 | Jakob | 361/388 |
| 4,070,081 | 1/1978 | Takahashi | 361/399 |
| 4,296,454 | 10/1981 | Wong | 361/386 |
| 4,314,311 | 2/1982 | Seytre | 361/386 |
| 4,342,946 | 8/1982 | Valenzona | 361/392 |

FOREIGN PATENT DOCUMENTS 2725340 12/1978 Fed. Rep. of Germany ...... 361/386

Primary Examiner—G. P. Tolin
Attorney, Agent, or Firm—Frishauf, Holtz, Goodman & Woodward

[57] ABSTRACT

To provide for simplified and less expensive manufacture without extensive insulation of internal components of a control system with respect to the housing, particularly for electronic ignition and fuel injection control systems, digital and other automotive control electronic systems and the like, a housing (1) of insulating plastic material has a connecting portion (2, 3) integrally formed therewith, which further include, integrally formed therewith, holding and engagement catches and slits (13, 15, 17-23; 62, 69) for a printed circuit board (41) carrying electronic network elements (42) such as transistors, capacitors, resistors, in integrated circuit form, or as discrete elements; and further a cooling device (24, 25; 56; 64; 73) in heat-conductive relationship to a power stage (43; 54; 65; 74) to dissipate heat generated within the power stage, and to transfer the heat over a large area surface connection either to a structural component carrying the entire control unit and/or to a sheet metal cover (49) snapped and crimped over the plastic housing (1) and, in sealed relation, closing off the entire structural unit.

15 Claims, 7 Drawing Figures

ENVIRONMENTALLY PROTECTED ELECTRONIC NETWORK STRUCTURE AND HOUSING COMBINATION

The present invention relates to an electronic network structure, and more particularly to electronic control equipment, which is protected against contamination or damage due to environmental influences, and especially to control circuits on printed circuit boards and the like, and electronic network components forming control systems for automotive vehicles. A typical application is the entire electronic control system, including active and passive components used in fuel injection systems.

BACKGROUND

Various electronic control systems are used in automotive vehicles. In order to decrease the length of connecting lines, it is desirable to place the control systems near the engine, and particularly under the hood of the engine compartment of an automotive vehicle, mounted preferably against a metal component of the vehicle or against the chassis, so that the housing can additionally function as a heat conductor to carry away heat generated within components of the control system which should be cooled.

Control systems, as heretofore, proposed usually were enclosed in metallic shells or housing structures. To secure a printed circuit board into the housing, as well as components forming plug-and-socket connections, screws, rivets or the like were usually used which, in order to provide insulation, required additional insulating washers, bushings, or the like. Assembling additional insulators into the housing increases both the costs of materials for the overall system, as well as assembly costs. The printed circuit board itself must be laid out such that sufficient space is provided for insulating regions thereon. Consequently, the printed circuit board cannot be miniaturized and made as small as consistent with the electrical network placed thereon, since additional structural space capable of absorbing stresses, vibration and shock encountered in automotive use has to be provided, while still permitting attachment of the printed circuit board, in insulated relation with respect to the metallic housing structure. Thus, the overall size of the unit is larger than that determined solely by the electrical characteristics of the components placed within the housing structure.

THE INVENTION

It is an object to provide an environmentally protected electronic network structure, particularly for use as control systems for automotive vehicles, which can be made smaller than heretofore, does not require any additional insulators within the housing, permits easy and ready attachment of connecting plugs, and is capable of dissipating heat from heat generating elements located on, or forming part of, the network structure.

Briefly, the housing is made as a tub or pan-shaped unitary element of insulating plastic material formed with an opening to receive plug or socket elements, and additionally formed with internal locating ribs, shoulders, projections and the like, to position and hold, for example by snap-in connections, a printed circuit board on which electronic network component elements such as resistors, capacitors, transistors, diodes and the like, in discrete or integrated circuit form, can be mounted. The plastic housing is covered over by a metallic cover, preferably snapped into a receiving groove or the like formed in the housing. The metallic cover additionally includes attachment lips and eyes and, preferably, also permits connection of a cooling fin or heat sink element either outside of the housing, by being passed through a slot thereof, or to the housing or to the metallic cover, the cooling element or heat sink being located immediately adjacent a circuit element which requires heat dissipation by an external heat dissipating element.

The structure has the advantage that no additional attachment elements for the printed circuit board within the housing is needed; thus, space on the printed circuit board can be efficiently utilized for the electrical requirements thereof. Further, the printed circuit board can be so shaped that it is directly usable as a connecting plug by extending the printed circuit board through the connecting opening of the plastic housing to receive a suitable connecting plug formed to engage connecting tracks on the printed circuit board, as well known by and itself. The heat generated in operation of a power element, such as a power transistor, for example, can be dissipated by connecting the power element in heat transfer relationship to the cover, or to an attachment lug which is adapted for attachment to a body or chassis portion of the vehicle, so that efficient heat transfer for heat dissipation is obtained. The overall structure can thus be made at a lower cost and assembled more rapidly and with less danger of errors or omission of parts, which are frequently difficult to detect in totally enclosed structures, while further permitting a reduction in size for a given network configuration.

In accordance with a preferred embodiment, a heat dissipating element is secured, either directly or by interposition of a thin heat transmitting but electrically insulating element on the metallic cover for the housing of the printed circuit board and the electronic components thereon. The electrical insulation of a power stage can be placed between the cooling element, to which the power stage is connected, and the cover; or, if the cooling element is made in separate parts, between the separate parts, one of which is directly connected to the cover and/or the chassis or frame of the vehicle, and the other to the element, the heat from which is to be dissipated. Covers and/or cooling elements can be used simultaneously as attachment elements or lugs of the overall structure in motor vehicles, thus insuring efficient heat transfer from the cooling element to the chassis or frame, or other metallic components of the motor vehicle, with which the structure is intended to be used.

The structure, of course, can also be used in other environments; it is, however, particularly suitable when severe operating conditions of shock, vibration, and environmental influences such as extremes in temperatures, and temperature gradients, and changes in ambient air pressure and air quality, such as moisture or pollution conditions, are encountered.

DRAWINGS

Figure 1:
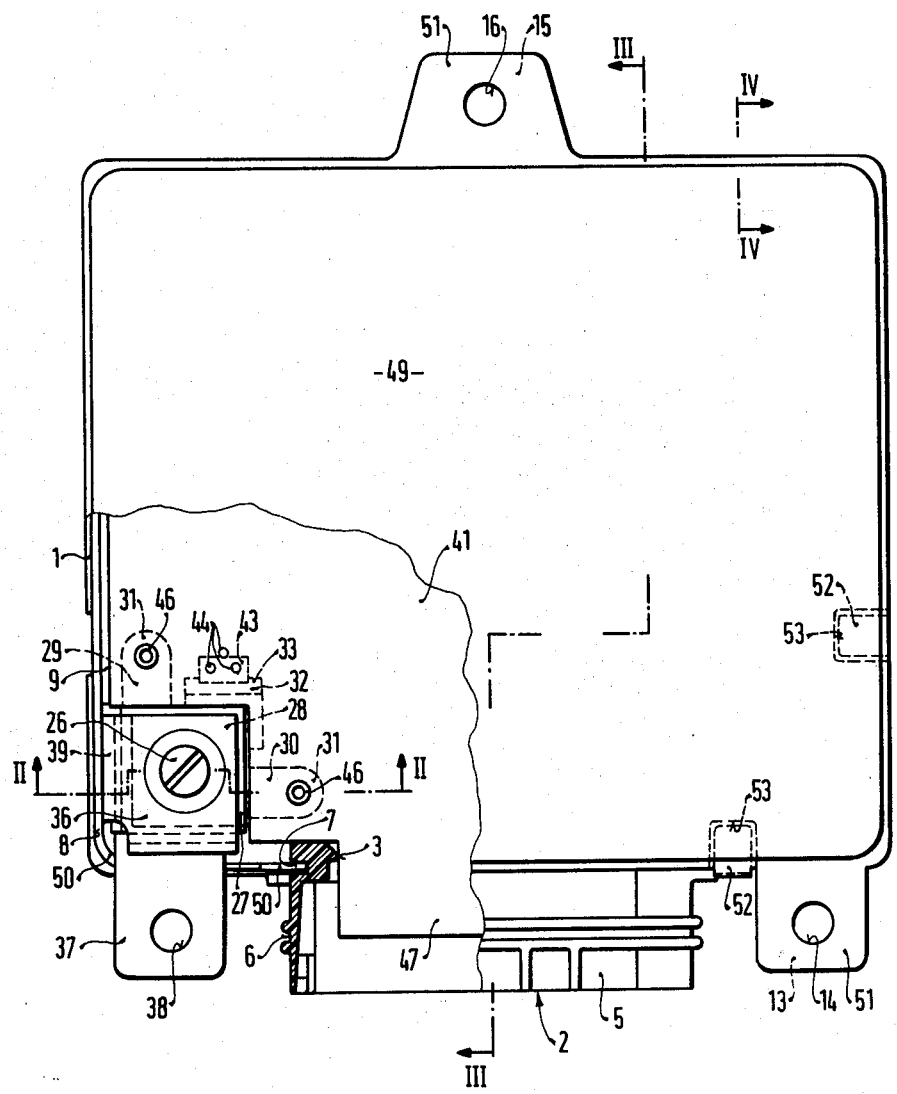
FIG. 1 is a highly schematic top view of the network structure in form of a control unit for a fuel injection system in an automotive vehicle, partly cut open to illustrate internal arrangements.

The electronic control unit structure has a housing 1 which is formed as an injection-molded structural element made of an electrically insulating plastic. Any suitable plastic material, customarily used in automotive applications, and being substantially inert and resistant against deterioration due to environmental influences, is suitable. The housing 1 is made of a base plate having, at the front side thereof, a receiving portion 2 for a multi-terminal plug-and-socket connection, to permit connecting the electronic network components within the circuit structure to external equipment. The receiving portion 2 has a housing wall 4, severed by a cross slit 3, and forming the back wall of the receiving portion. An essentially oval guide ridge 5 projects forwardly from the wall 4 in order to snugly surround a plug unit of a multi-terminal plug connector (not shown), as is well known in removable plug-and-socket connections in the electrical field. The generally oval rim or boot 5 surrounds the slit 3 with clearance and is formed at its outer side with a ring groove 6 in order to receive a sealing sleeve or a boot of a matching connecting plug. The housing wall 4, in general, is trapeze-shaped. A groove 7—see FIG. 3—is formed at the inclined side of the upper portion of the wall 4, the groove 7 extending at the circumference of the wall 4, and merging into a flatter or narrower groove 8—see FIG. 1. The groove 8 is formed on the base plate of the housing 1 outside the rim 9 which extends somewhat upwardly from the base plate. Besides the housing wall 4, a projection 10 (FIG. 2) is formed on the base plate. Projection 10 has a cross slit 11 at the same height as the cross slit 3 of the housing wall 4. The back side of the housing wall 4 as well as well as the projection 10 is formed with an upwardly extending chamfer 12 adjacent the respective cross slits 3, 11 to provide insertion reliefs for insertion of a printed circuit board, as will appear.

An attachment lug 13 extends close to the right side of the front edge of the housing 1, the lug 13 having an attachment hole 14 (FIG. 1). A further attachment lug 15 with an attachment hole 16 is located at the center of the backside of the housing 1.

Figure 3:
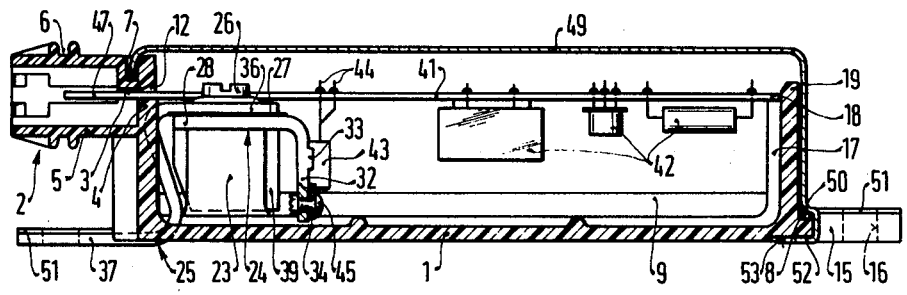
FIG. 3 is a longitudinal sectional view along the offset or broken section line III—III of FIG. 1.
Figure 4:
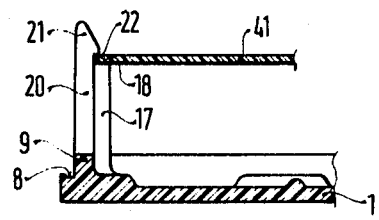
FIG. 4 is a partial sectional view along line IV—IV of FIG. 1.

Three rigid abutment projections 17 extend at the edges and in the center adjacent the edge 9 at the back side of the housing—see FIG. 3. The abutment projections 17 have an engagement surface 18 placed at the height of the lower rim of the slits 3 and 11. The abutment surface 18 faces the receiving portion 2, and is defined at the back side by a projecting stop 19. Two elastic snap-in projections 20—see FIG. 4—are formed between the abutment projections 17; the snap-in projections 20 have engagement hooks 21 having holding surfaces 22 at the level of the upper edge of the cross slits 3 and 11.

Figure 2:
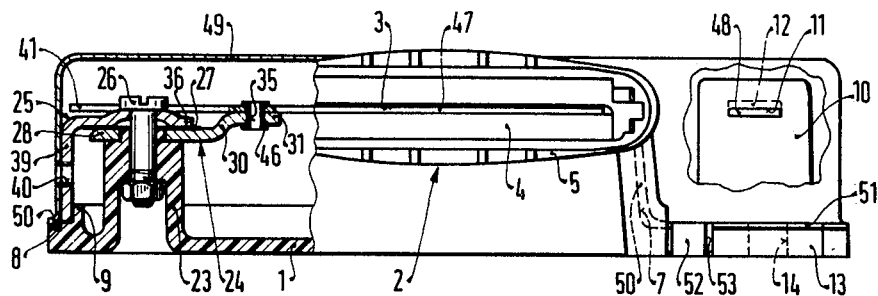
FIG. 2 is a front view, partly in section along line II—II of FIG. 1.

The base plate of the housing 1 is formed with an attachment eye 23 between the left edge of the housing and the receiving portion 2—see FIG. 2. A two-element or two-part cooling device 24, 25 is secured to the attachment eye 23 with a screw 26. The cooling device has a cooling plate 24 and a cooling angle 25. An electrical insulating plate 27 is positioned between the plate 24 and the angle 25.

The cooling plate 24 has an essentially rectangular plate abutment portion 28 formed with a square hole, which portion 28 has, at transverse edges, attachment projections or flaps 29, 30, respectively (FIG. 1). The attachment flaps 29, 30 are so offset (FIG. 2) that the surface of the end portions 31 thereof will be in the same plane above the base plate as the lower edge of the cross slits 3 and 11 of the housing 1. The longitudinal axes of the attachment flaps 29, 30 extend, mutually, at a right angle with respect to each other. The corner formed by the attachment flaps 29, 30 of the cooling plate 24 receives an attachment angle 32 which is bent over at right angles from the engagement plate portion 28 and also bent over a right angle with respect to the attachment flaps 29, 30. The attachment angle 32 is formed at the lateral edges with guide projections 33 and has a hole 34 therethrough, positioned on its longitudinal axis. Likewise, a hole, each, shown at 35 is formed in the two end portions 31 of the attachment flaps 29, 30.

The cooling angle portion 25 generally is double-bent in essentially S-shape. The upper leg 36 is formed with a hole through which the screw 26 extends. The lower leg 37 is shaped in form of an attachment lug. The attachment lug leg 37 extends from the housing 1 and corresponds, in shape, generally to the attachment lug 13. A hole 38 is formed in the attachment lug leg portion 37. The upper leg 36 of the cooling angle 25 has a laterally bent-over flap 39 (FIGS. 2, 3) with a tapped hole 40 therein.

A printed circuit board 41 retains and supports all the electronic and electrical circuit elements 42 of the control unit, shown, for example, in form of a control unit for a fuel injection for an automotive internal combustion engine. All the conductive connecting tracks—not further shown—are also on the printed circuit board 41. At least one of the electronic or electrical structural elements are of such power rating that they become hot in use, and thus require cooling. One such element is shown as a power stage 43 which requires external cooling to draw off heat generated due to resistance losses.

As shown, the power stage 43 has three connecting electrodes 44. The center one of the three electrodes 44 is offset. All three connecting electrodes 44 (FIG. 3) extend through suitable holes of the printed circuit board 41 within the range of the associated conductive tracks. The various connecting leads and the conductive tracks of the printed circuit board are all soldered together by any suitable, for example automatic, soldering process to provide reliable connection to the other circuit elements 42 by the conductive tracks on the printed circuit board. The power stage 43 is directly seated on the attachment angle 32 and placed between the guide projections 33. It is secured on the attachment angle 32 by a rivet 45 extending through the hole 34 and is thus connected in heat transfer relation to the cooling plate 24. The cooling plate 24 is riveted to the conductive plate 41 with eyelet rivets 46. The rivets 46 extend through the holes 34 in the attachment flaps 29, 30 of the cooling plate 24—see FIG. 2. The printed circuit board 41 has a plug end 47—see FIGS. 1 and 3—which is formed with conductive tracks, not shown, and as well known; the projecting tongue 47 with the contact tracks thereon forms the plug unit for the multi-terminal connector, for placement thereof in the receiving portion 2. The tongue 47 with the contact tracks thereon also, at least in part, forms the multi-terminal plug housing for the connector of the control system together with the receiving portion. The printed circuit board 41 is further formed with an abutment tongue 48—see FIG. 2—in addition to the projecting connecting tongue 47.

Assembly: The printed circuit board 41 is assembled with the various electrical and electronic elements 42, the cooling plate 24 is riveted thereto, and the connecting electrodes of all the electrical components 42, 43 and the associated tracks on the printed circuit board—not shown—are soldered. The circuit is then electrically and mechanically tested, and the circuit board 41 is located in the housing 1. To do so, the tongues 47 and 48 are slipped along the bevels or chamfers 12 along the cross slits 3 and 11 of the housing 1. The printed circuit board 41 is then pivoted about the walls of the slits until the edge opposite the tongues 47,48 fits on the abutment surfaces 18 of the projections 17—see FIG. 3. In this position, the snap hooks 21 of the snap-in projections 20 will snap over the edge of the printed circuit board 41—see FIG. 4. The snap hooks will hold the printed circuit board 41 securely in and on the housing 1. The abutment stops 19 which limit the abutment surfaces 18 prevent shifting of the board 41 and accept forces which arise when the plug-and-socket connection to the tongue 47 is made by a suitable matching socket. The abutment connections 17 and 18 and the rigid abutments 19, as well as the projections 20 with the overlapping projections 21, reliably hold the printed circuit board 41 in position, secure against shock and vibration.

The cooling arrangement or combination 24, 25 will become seated on the attachment eye 23. The square holes in the cooling plate 24 and in the insulating plate 27 permit non-rotatable relative positioning, and insure that the cooling angle 25 with the leg 39 is engaged at the outside against the edge 9 of the housing 1—see FIG. 2. After placing of the printed circuit board 41 in the housing, as above described, the cooling plate 24 and the insulating plate 27 are fitted on the attachment eye 23 and, together with the cooling angle 25 seated thereon, are secured together by screw 26. Screw 26 can be secured against rotation by a counter nut. The screw connection provides for good heat transfer from the cooling plate 24 to the cooling angle 25. The heat is further transferred, efficiently, from the cooling angle 25 over the lug 37 which forms an attachment lug for the entire control unit and is secured to a structural element, for example of the motor vehicle with which the structure is used. If, for example, the portion or structural element of the motor vehicle to which the control unit is attached is made of a material which is not readily heat conductive, and higher heat dissipation is required for the control unit, it is possible to additionally connect a hood-like cover 49, made of sheet metal, and placed over the base as a heat dissipating element.

The cover 49 extends over the edge 9 of the housing 1 in the grooves 7 and 8. A sealing strip 50 is preferably placed between the cover and the groove in order to completely seal the interior of the control unit structure, and to protect the electronic components therein. The cover 49 has three attachment lugs 51 which are placed on the attachment lugs 13, 15 of the housing 1 and on the leg 37 of the cooling device 24, 25. The cover 49 is secured on housing 1 in a suitable manner, for example by screws, not shown, and simultaneously connected to the chassis or frame or a structural component of the motor vehicle. Heat transfer thus is effected from the lug 37 of the cooling angle 25 to the cover 49. Additional heat transfer can be obtained by a heat transfer connection by screw-connecting the cover 49 and the flap 39 (FIG. 2) of the cooling angle 25. Corrosion protection, such as black painting and lacquering of the cover 49 additionally increases the conduction and radiation of heat from the power stage 43 and of heat from warmed air within the housing 1.

Cover 49 is formed with lugs 52 distributed around the circumference thereof—see FIGS. 2, 3. The lugs 52 grip around the base plate of the housing 1 and are fitted in recesses 53 at the bottom side of the housing 1, for example by being pressed thereinto. The lugs 52 are simple ways of rapidly and securely connecting the cover 49 to the housing 1.

Figure 5:
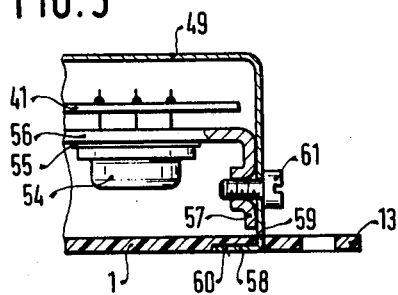
FIG. 5 is a fragmentary longitudinal sectional view illustrating another embodiment of the cooling arrangement.
Figure 6:
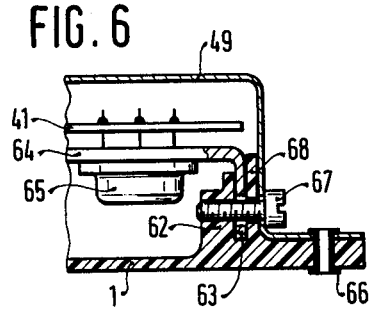
FIG. 6 is a fragmentary longitudinal sectional view illustrating yet another embodiment of the cooling arrangement.
Figure 7:
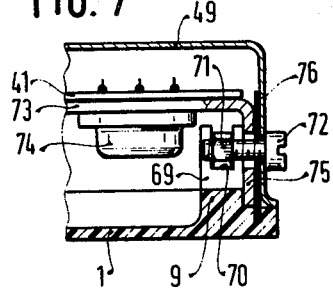
FIG. 7 is a fragmentary longitudinal section view illustrating yet a further embodiment of the cooling arrangement.

Various changes and modifications may be made; FIGS. 5 to 7 illustrate different embodiments for cooling of the power stage.

Embodiment of FIG. 5: A power stage 54 which does not heat excessively, and thus does not require a high degree of heat conduction, is insulated, in known manner, by an insulating disk 55 between the power stage 54 and a cooling angle 56. The cooling angle 56 has a bent-over leg 57 which is directly connected by screw 61 to the cover 49 of the control unit structure. The cover 49 has lugs 58 which extend in the region of the attachment lugs 13 through slits 59 in the base plate of the housing, and then fit within recesses 60 at the bottom side thereof. Screw 61 insures good heat transfer between the angle 56, 57 and the cover 49.

Embodiment of FIG. 6: This arrangement is also suitable for heat transfer from power stages having comparatively low heat dissipation requirements. The housing 1 is formed with an attachment eye 62 at the inner region thereof, and with a slit 63 to receive a cooling angle portion 64. The power stage 65 is directly secured to the cooling angle. The cover 49 is riveted to the attachment lug 13, 15 of the housing 1 by rivet 66. Screw 67 interconnects the cover 49, the portion 68 of the attachment eye 62 and forming an insulating plate as well as a wall separated by a groove, so that the attachment eye portions 62, the plate 63, and the cover 49 are tightly and securely connected together. Preferably, the hole through the cooling angle 64 is substantially larger than the outer diameter of screw 67. The attachment eye 62, defining the placing or fitting groove by the back wall 68, then insures proper positioning of the angle 64, with clearance, around the screw 67. Alternatively, screw 67 can be made of non-conductive, for example plastic material, such as nylon.

Embodiment of FIG. 7: Housing 1 is formed with an attachment eye 69 into which a slit 70 is placed receiving a counter nut 71 for a screw 72. Cooling angle 73 is secured to the printed circuit board 41. It carries, directly, the power stage 74 without interposition of an insulating disk. The cooling angle 73 is fitted with its leg 75 over the edge 9 of the housing wall. Screw 73 secures together the cover 49, an interposed insulating plate 76 between the inner side of the cover and the leg 75 of the cooling angle 73, and the attachment eye 69. This arrangement is particularly suitable if the heat to be dissipated from the power stage 74 is not too high, and if the respective electrical and electronic elements of the unit on the printed circuit board 41 are not particularly sensitive to heating.

Various other changes and modifications may be made, and features described in connection with any one of the embodiments may be used with any of the others, within the scope of the inventive concept.

A particularly suitable material for the base plate 1 is: Polyamid 6.6 glass fiber reinforced.

The cover 49, preferably, is ordinary drawn sheet metal, for example rust-proofed sheet steel, having a thickness of, for example: 0.5 to 1.0 mm.

The base dimension of the plate 1, to retain an entire automotive fuel injection control system for a 4,6, or 8 cylinder engine then need have a dimension of only 15 cm × 15 cm.

A suitable connector plug to connect to the conductive strips on plate 41 is disclosed in German Patent Disclosure Document No. 30 20 903, and in U.S. application Ser. No. 268,075, filed May 27, 1981, JANDREY et al., "Multi-Terminal Plug Connector," now abandoned; assigned to the assignee of this application.

We claim:

1. Environmentally protected electronic network structure, particularly a control system for automotive vehicles, including a printed circuit board (41) and electrical and electronic circuit elements (42, 43, 65), at least some of which (43, 65) require cooling, having
    a housing (1) retaining said printed circuit board;
    a cover (49) closing off the housing,
    the electrical and electronic circuit elements being supported on the printed circuit board;
    a heat conducting element (24, 25; 73, 75) located in thermal transfer relation with respect to said at least some circuit elements requiring cooling to conduct heat therefrom;
    and an externally accessible multi-terminal connection socket (2) to provide externally accessible electrical terminals,
    wherein
        the housing comprises a unitary pan or tub-shaped element (1) of an electrically insulating plastic material;
        said printed circuit board (41) having a unitary projecting portion forming a projecting contact terminal strip (47);
        said housing being formed with a slit (3) through which said projecting terminal portion extends, and further being formed with a plug receiving portion externally of the slit and adjacent the projecting portion (47) of the printed circuit board, with clearance, to permit engagement with a plug connector for the terminals of the terminal strip on the printed circuit board;
        said unitary plastic element being further formed with internal locating means for positioning and holding the printed circuit board (41) therein;
        being additionally formed with an internal attachment means (23, 62, 69) for attachment, in heat transfer relation, of said heat conducting element (24, 25; 73, 75);
        and being additionally formed with external attachment means (13, 15) for attachment of the housing to a support structure on the vehicle;
        and wherein said cover (49) comprises a metal lid secured to said housing element (1) and closing off the pan or tub-shaped element, while providing for radiation of heat generated by the electrical and electronic elements positioned within the housing.

2. Structure according to claim 1, wherein the plug receiving portion is a rim or boot (5) extending over the slit and surrounding the projecting portion (47) of the printed circuit board, with clearance.

3. Structure according to claim 1, wherein said internal locating means comprises abutment projections (21) formed in the housing for positioning of the printed circuit board;
    and holding means (21) comprising internally projecting resiliently deflectable snap-over projections, positioned for cooperation with said abutment means (18, 19) and snapping over the printed circuit board (41).

4. Structure according to claim 1, wherein said attachment means (23; 62; 69) comprises attachment eyes positioned in the housing in engagement with said cooling element (24; 25; 73, 75).

5. Structure according to claim 1, wherein said heat conducting element comprises a metal element connected in heat transfer relationship with said cover lid (49) while being electrically insulated therefrom;
    and wherein an electrical circuit element (74) requiring cooling is directly connected to said metal element.

6. Structure according to claim 5, wherein the metal element (64) is further extended and secured to an attachment eye adapted for attachment to the support structure of the vehicle for direct heat transfer to said support structure of the vehicle.

7. Structure according to claim 6, wherein said attachment eye is directly connected to the attachment means of said housing.

8. Structure according to claim 1, wherein the heat conducting element comprises a two-part structural element (24, 25).

9. Structure according to claim 8, further including an insulating element (27) positioned between the two parts of the heat conducting element.

10. Structure according to claim 9, wherein one of the parts (25) of the heat conducting element includes a connecting terminal lug (37), positioned to extend outside of said housing (1) and forming part of the external attachment means for the housing.

11. Structure according to claim 10, further including at least one attachment lug (51) formed on the cover lid (49) and contiguously positioned over the lug (37) which is a component of the part (25) of the heat conducting element extending externally of the housing.

12. Structure according to claim 1, wherein the housing (1) is formed with recesses (53);
    and the cover lid (49) is formed with attachment lugs (52) fitting into said recesses.

13. Structure according to claim 1, wherein the housing (1) is formed with a circumferential groove (7);
    the cover lid (49) has portions seated in the groove;
    and a sealing means (50) is provided sealing the edge of the cover lid in the groove and against the housing.

14. Structure according to claim 13, wherein the groove (7) is formed as a recess located in the region of the connecting socket (23) and extends in form of a circumferential groove (8) extending around the remainder of the housing element.

15. Structure according to claim 1, wherein at least a part of the heat conducting element (25; 56) is directly secured to the cover lid (49) for direct heat transfer thereto.

* * * * *